United States Patent
Moukara et al.

(10) Patent No.: US 7,339,652 B2
(45) Date of Patent: Mar. 4, 2008

(54) APPARATUS FOR PROJECTING A PATTERN INTO AN IMAGE PLANE

(75) Inventors: Molela Moukara, München (DE); Rainer Pforr, Weixdorf (DE); Thomas Muelders, Dresden (DE); Mario Hennig, Dresden (DE); Karsten Zeiler, München (DE)

(73) Assignee: Infineon Technologies AG, Neubiberg (DE)

( * ) Notice: Subject to any disclaimer, the term of this patent is extended or adjusted under 35 U.S.C. 154(b) by 200 days.

(21) Appl. No.: 11/339,844

(22) Filed: Jan. 26, 2006

(65) Prior Publication Data
US 2006/0181691 A1 Aug. 17, 2006

(30) Foreign Application Priority Data
Jan. 27, 2005 (DE) .................... 10 2005 003 905

(51) Int. Cl.
G03B 27/54 (2006.01)
G03B 27/72 (2006.01)
G03B 27/42 (2006.01)

(52) U.S. Cl. .................... 355/67; 355/71; 355/53

(58) Field of Classification Search ............... 355/67, 355/53, 71, 77; 430/311
See application file for complete search history.

(56) References Cited

U.S. PATENT DOCUMENTS

| 6,045,976 A | 4/2000 | Haruki et al. |
| 6,704,092 B2 | 3/2004 | Shiraishi |
| 2002/0036758 A1 | 3/2002 | De Mol et al. |
| 2004/0139418 A1 | 7/2004 | Shi et al. |
| 2005/0007573 A1 | 1/2005 | Hansen et al. |

OTHER PUBLICATIONS

"Alternating Phase-Shifting Mask", pp. 117-121, 2001.

*Primary Examiner*—Peter B. Kim
(74) *Attorney, Agent, or Firm*—Edell, Shapiro & Finnan, LLC

(57) ABSTRACT

An improvement of the imaging quality with simultaneous transfer of line-space gratings and peripheral structures including a MUX space is achieved using a quadrupole illumination whose poles are formed in elongate fashion and whose longitudinal axes are arranged perpendicular to the orientation of the lines of the line-space grating arranged on a mask. The structure imaging of the line-space grating is improved with regard to contrast, MEEF, and process window, while the geometrical fidelity of the peripheral structure, in particular of the MUX space, is stabilized over a wide depth of field range.

22 Claims, 5 Drawing Sheets

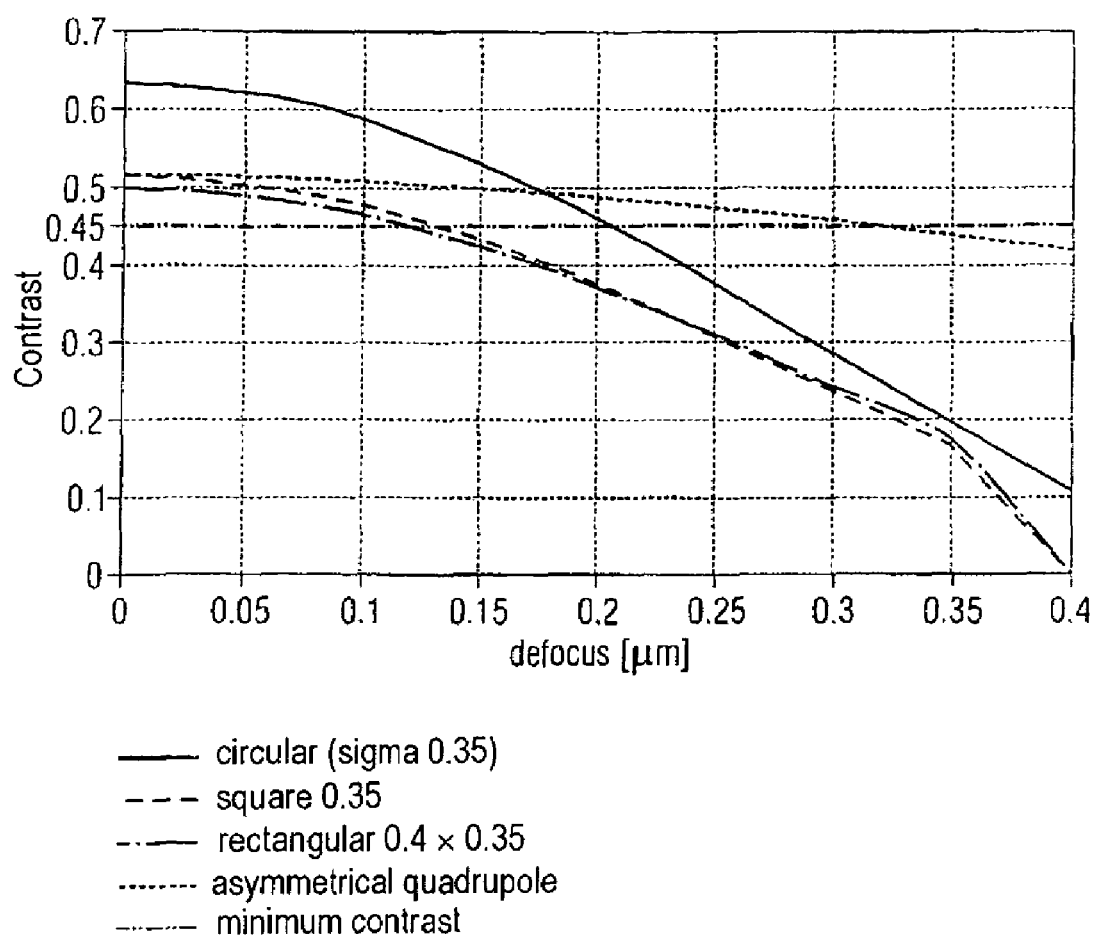

APPARATUS FOR PROJECTING A PATTERN INTO AN IMAGE PLANE

CROSS REFERENCE TO RELATED APPLICATIONS

This application claims priority under 35 U.S.C. §119 to German Application No. DE 10 2005 003905.7, filed on Jan. 27, 2005, and titled "Arrangement for Projecting a Pattern into an Image Plane," the entire contents of which are hereby incorporated by reference.

FIELD OF THE INVENTION

The invention relates to an apparatus for projecting a pattern from a mask into an image plane into which a semiconductor substrate may also be introduced.

BACKGROUND

With advancing miniaturization in semiconductor technology, so-called resolution enhancement techniques (RET) are increasingly being employed. These techniques involve improving the resolution capability of an optical imaging system by utilizing or influencing the wave and phase properties of the imaging light beam beyond that of a straightforward projection of the pattern. Examples of such techniques are the use of oblique light illumination in the illumination optical system of an exposure apparatus, so-called off-axis illumination, or phase shift masks, which are differentiated further according to the type of alternating or attenuated phase shift masks, etc.

Specifically, these techniques are adapted to the requirements of a pattern that is currently to be transferred onto a semiconductor wafer. Problems occur, however, when partial patterns that are subject to different requirements made of the RET exist within a pattern. Since the imaging of a mask can be performed only under uniform conditions, the common process window existing for the projection is thereby degraded. It is necessary to make compromises between the desired resolution, the contrast, the positional accuracy, the permissible depth of field range, etc. The problem can be explained in more detail using an example. The lithographically formed structure elements of active zones of a memory component using trench capacitor technology are close to the resolution limit of an imaging system for memory cells. The peripheral structures of the memory component likewise comprise active zones, but are not subject to the high requirements of structure density and width. For example, these structures may have a width that is a factor of three to four times greater than that of active zones in the cell region.

One conventional solution approach involves performing a double exposure. In this case, the resolution-critical line-space grating structures of the cell region are transferred by a first oblique illumination, e.g., a dipole illumination. As an alternative to this, it is also possible to use an alternating phase shift mask for the projection onto the semiconductor substrate, the appropriate line-space grating structures being formed on the mask.

By contrast, those spaces and lines which represent structure elements from the periphery are usually imaged by a three-tone mask under annular illumination. Chromium masks are also often used instead. For this purpose, the corresponding pattern portions, while still in the design stage, are taken from the layout of the first mask and combined in a new, second layout, from which is created the second mask for the double exposure.

However, the double exposure also entails considerable disadvantages. First, the time expenditure is doubled owing to the masks that must be changed during each exposure process. This is accompanied by a reduction in productivity. If it is taken into consideration that the greatest proportion of costs in semiconductor production arises as a result of the apparatus time in the area of photolithography, then this disadvantage also directly influences the cost budget. The production costs for the mask are also doubled.

Second, an alignment must be carried out in each case for the exposure of the relevant lithographic plane (in the example: active zones). Unavoidable errors as a result of a limited alignment accuracy additionally restrict the predetermined tolerance budget.

In the example of forming active zones in the cell and peripheral regions of a memory component, more extensive problems arise in connection with the imaging of the so-called MUX space, which serves for forming multiplexers in the integrated circuit. The MUX space lies in the peripheral region in direct proximity to the edge of the cell region and comprises a complex, semi-laterally closed line-space structure having a line-to-space ratio of approximately 1.5. If the corresponding space structure is formed as an alternating phase shift mask, for instance, then phase conflicts inevitably arise at the branchings of the spaces.

Therefore, one goal is to transfer the layout into the image plane or onto the substrate in the context of a single exposure. Solution approaches are known for this purpose, too. By way of example, it has been attempted, by using a symmetrical quadrupole illumination adapted to the layout of the mask (e.g., chromium or attenuated phase shift mask), to simultaneously transfer both the line-space grating and the structure elements arranged peripherally with respect to the cell region, in particular also the MUX space, in just one exposure.

The type of illumination originating from the radiation source thus has a significant influence on what orders of diffraction contribute in what way to the image construction in the image plane. In this case, the radiation source is to be understood to be an "effective source" in which not only the finite extent of the light-generating source itself plays a part, rather the form of the illumination pupil arranged at a position between light-generating source and mask in the beam path of the exposure apparatus is also of importance.

By setting the illumination pupil, it is possible to realize oblique light, dipole, quadrupole, annular, rectangular, or circular illumination. The pupil is situated in a Fourier-transformed plane relative to the mask or in a conjugate plane relative to the radiation source.

A quadrupole illumination is applied in the prior art by openings that are essentially shaped in square fashion, or generally light-transmissive bright zones, having an identical size being positioned symmetrically and equidistantly from the optical axis defined by the beam path on axes oriented perpendicular to one another in the pupil plane. In the example of the line-space grating, two of the square pupil bright zones are thereby respectively oriented parallel to the orientation of the grating, and the other two bright zones are oriented perpendicular to the orientation as soon as the mask is introduced in the beam path at the location of the mask plane.

One disadvantage of this type of illumination exists insofar as the two bright zones arranged along an axis parallel to the grating orientation can scarcely contribute to the image construction of the lines and spaces of the grating in the image plane. Therefore, they degrade the aerial image contrast considerably, with the result that the size of the process window is significantly reduced. A process window is defined by an interval of permissible combinations of focus and dose values for an exposure.

A further negative consequence is that the value of the MEEF (mask error enhancement factor) for the line-space grating is drastically increased, whereby the uniformity with which desired line widths are obtained is impaired. The MEEF represents the nonlinear behavior during the transfer of errors present anyway on the mask (structure width) onto the semiconductor wafer, which generally commences in the case of structure elements having widths close to the resolution limit.

One alternative involves the use of a hybrid mask which combines elements of an alternating phase shift mask for the formation of the line-space grating and also elements of a chromium mask for the peripheral structures with one another. The application of the technology of alternating phase shift masks makes it possible to achieve a high contrast value in the aerial image arising in the image plane, a large process window, and a low MEEF value for the line-space grating.

However, the quality of the imaging of the line-space grating is coupled to a considerable extent to the type of illumination of the lines and spaces formed in alternating phase shift mask technology. Line-space gratings formed in this technology typically produce particularly high contrast values and low MEEF values during the projection precisely when a virtually coherent illumination is used. An illumination that is as coherent as possible is obtained by an arrangement of the bright zones in the pupil plane that lies close to the optical axis—also called zero point or origin.

Known embodiments of pupils that have been used especially in combination with hybrid masks therefore form centrally centered, virtually coherent effective sources. Such a pupil selection conflicts with the imaging of the peripheral structures, which is preferably to be performed using oblique light illumination (dipole or annular). The result is a significantly reduced imaging quality of the peripheral structures. This applies particularly to the MUX space as well, in particular when the depth of field range is intended to be utilized (i.e., high defocus values are set). If, on the other hand, an oblique light illumination adapted to the peripheral structures is set in the case of the hybrid mask, then a contrast value of less than 0.45 is obtained for structure elements of the line-space grating in the aerial image that arises in the image plane. Such a low contrast value is no longer acceptable for a subsequent processing of a resist on a wafer that is exposed in the image plane.

SUMMARY

The present invention provides an arrangement for a single exposure which permits the simultaneous projection both of dense, periodic line-space gratings and of less dense, but in return complexly patterned peripheral structures in conjunction with a high imaging quality. This approach reduces the outlay and the costs for semiconductor production and improves the quality of the semiconductor production. Further, the invention provides a technique that enlarges the process window of the imaging both for the line-space gratings of the cell region and for the MUX space of the peripheral region in a pattern of active zones of memory cells. The MEEF values are reduced in the simultaneous projection of line-space gratings and complex peripheral patterns, so that the line widths of the structures in the resist of a wafer on the mask remain controllable. Further, the required outlay for corrections to the layout of the peripheral structures is reduced in comparison with the prior art.

According to an exemplary embodiment of the present invention, an arrangement for projecting a pattern into an image plane, comprises: an exposure apparatus having an effective source comprising a radiation source and an illumination pupil, a lens system, a mask plane, an exit pupil and an image plane, which are arranged along an optical axis; a mask arranged in the mask plane of the exposure apparatus, on which mask is formed the pattern for the projection, and which mask is formed as an alternating phase shift mask in a first region, and is formed as an attenuated phase shift mask or as a chromium mask in a second region. The illumination pupil, assigned to the effective source, produces a quadrupole illumination for the mask. The illumination pupil includes at least four bright zones that are spaced apart from the optical axis, so that the second region is projected into the image plane with an increased depth of field range. At least some of the bright zones are formed in elongate fashion, so that the first region is projected into the image plane with an increased contrast, and at least some of the bright zones have longitudinal axes arranged parallel to one another.

Provision is made, for example, for combining a hybrid mask, which is a combination of alternating phase shift mask and either chromium mask or attenuated phase shift mask, with an illumination pupil that provides a quadrupole illumination in a common arrangement. At least one of the bright zones of the quadrupole illumination is formed in elongate fashion. The arrangement may comprise an exposure apparatus equipped with the mask in the mask plane, with the substrate in the image plane and with an illuminator diaphragm as pupil in the pupil plane.

The pupil may be for example a diffractive optical element (DOE) or else a diaphragm which operate in transmission or reflection. They have, in any event, predetermined transparent bright and nontransparent dark zones. However, the invention is not restricted to diaphragms or DOEs for forming an illumination pupil. Rather, all such optical elements that impair the distribution of the radiation flux through the pupil plane of the illuminator optical system are taken into consideration. The optical element may be able to be set mechanically or electronically with regard to the form of the bright zones.

The exposure apparatus has a radiation source, which generates monochromatic light. The lens system including optional deflection mirrors is assembled, e.g., such that the radiation source, the illumination pupil, and the exit pupil are conjugate with respect to one another, while the mask plane and the image plane are positioned in Fourier-transformed planes with respect thereto. Such a construction of typical exposure apparatus is sufficiently known to the person skilled in the art of optical lithography or they are described extensively in the literature as devices for instance of the step-and-scan type for the exposure of semiconductor wafers. The disclosure of U.S. Pat. No. 6,704,092 B2 provides such an example.

What is crucial is that the pupil and the hybrid mask interact by way of the exposure apparatus for producing a high-resolution image of the pattern on the mask in the image plane.

The bright zones of the illumination pupil are arranged in the pupil plane and form the effective source together with the actual light-generating radiation source. The pupil preferably comprises four bright zones.

According to one embodiment, to produce an asymmetrical quadrupole illumination for the irradiation of the mask, the four openings are not arranged or shaped in the same way. At least one of the bright zones differs from the rest of the bright zones in terms of form and/or distance from the zero point position, i.e., the optical axis.

One combination of features provides for none of the openings to be situated in the zero point position, i.e., on the optical axis—they are spaced apart from it.

As used herein, the term "asymmetrical" is understood to mean, with regard to the quadrupole illumination, each arrangement of openings which is not converted into itself again upon a rotation through 90 degrees about the zero point position. In this respect, in this definition a merely mirror-symmetrical arrangement of openings is also deemed to be "asymmetrical" and is therefore concomitantly encompassed by this configuration of the invention.

At least one of the bright zones is formed in elongate fashion. It has a greater length along a longitudinal direction than along a transverse direction perpendicular thereto, i.e., its width is less than the length, so that, in particular, it is not square or circular. In particular, a rectangular opening may be involved. However, further forms are also conceivable, such as, for instance, ovals, ellipses, or dumbbell-shaped figures.

One preferred refinement provides for two bright zones to be formed in elongate fashion. A further refinement provides for all four bright zones to be formed in elongate fashion. In this case, the longitudinal axes can be oriented in the same direction. If the first region comprises a line-space grating having a grating orientation along the lines, then the orientation of the longitudinal axes according to the invention is arranged perpendicular to the grating orientation of the lines and spaces.

The hybrid mask has two regions over which the pattern formed on the mask extends. They are formed using different mask production techniques: the first region is of the alternating phase shift mask type. That is, the first region comprises lines and spaces, the transparent spaces alternately having around the lines a phase deviation of 0 degrees and 180 degrees, respectively. The degree of transparency is essentially identical. The lines are opaque and formed, e.g. as chromium webs, but are not restricted to this choice of material for the absorber. In principle, semitransparent layers are also provided for the line construction, for instance molybdenum silicide or other greatly light-attenuating materials.

The first region may also be formed as a chromeless phase shift mask.

The second region is formed as a chromium mask or as an attenuated phase shift mask. Chromium or molybdenum silicide are correspondingly used in this case, too. However, the invention is not restricted to these materials. Rather, all absorber materials known to the person skilled in the art, whether they are opaque or only light-attenuating and whether they are phase-shifting or not phase-shifting, are taken into consideration. In the case of the attenuated phase shift mask, provision is made both of such light-attenuating layers which have a low light transmissivity (e.g., 4-10%) and of those which have a high light transmissivity (10%-30%, so-called high-transmission phase shift masks). The second region may also be formed as a three-tone mask.

The first and the second regions may each by themselves be contiguous or in turn separated into many sub-regions. Each of the regions may also consist only of an area having a microscopic extent and comprise for example only a few lines and spaces.

A particularly advantageous refinement with regard to the regions is for the first region of the alternating phase shift mask type to have line-space gratings. These grating arrangements preferably comprise lines and spaces oriented parallel, of which the latter are provided with an alternating phase deviation.

One preferred embodiment provides for forming particularly densified gratings, i.e., lines and spaces having a small width and a small grating spacing in comparison with other structures on the mask, for the first region of the alternating phase shift mask type. By contrast, the remaining structures of the mask, which may also comprise line-space gratings which then have a larger grating constant, however, have the features of the second region, i.e., are of the chromium or attenuated phase shift mask type.

The effect of the invention is that densified arrangements which are formed such that they are of the alternating phase shift mask type are transferred into the image plane with high contrast with orders of diffraction that are far removed from the zero point position in the Fourier spectrum, despite the oblique light illumination, on account of the quadrupole. This is made possible by the elongate formation of the bright zones along a preferred direction. The preferred direction or longitudinal axis of the bright zones is perpendicular to the position of the orders of diffraction in the Fourier plane, so that, upon the convolution of the Fourier planes (pupil plane, Fourier spectrum of the mask layout in the aperture plane or exit pupil), the remote orders of diffraction do not fall out of the aperture plane or exit pupil and therefore now contribute to the image construction.

The less dense structures of the grating periphery, by contrast, are imaged with a large depth of field range precisely owing to the still existing oblique light illumination, i.e., with reduced coherence. In this respect, the invention brings about a large process window during the projection into the image plane.

As an alternative or in addition to a consideration of the structure densities, the invention also provides for assigning line-space gratings to the first or second region as early as before the production of the hybrid mask. This involves checking whether there are phase conflicts on account of transparent, but mutually phase-shifted spaces impinging on one another. If phase conflicts exist, then the corresponding phase grating is assigned to the second region and formed as a chromium or attenuated phase shift mask.

One concrete embodiment of the invention provides for forming the layout of active zones for the production of memory components (trench capacitor technology) using hybrid mask technology. The line-space gratings representing active zones within the memory cell array are formed by the alternating phase shift mask type. The active zones of the periphery are formed by the chromium or attenuated phase shift mask type. This also includes the MUX space that is beset with phase conflicts in the case of alternating phase shift masks.

In principle, however, the invention is also provided for the imaging of any other layout planes. This holds true particularly in those cases in which dense periodic gratings are combined with less critical pattern parts in the same pattern. Another case relates to larger gratings with portions of isolated spaces on one side and respectively connected spaces on the other side. Phase conflicts may then occur in the second case. In this case, too, the solution is a hybrid mask which is illuminated and brought to projection on the basis of the pupil according to the invention.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

FIG. 6 shows a diagram with contrast values for different types of illumination pupils.

DETAILED DESCRIPTION

Figure 1A:
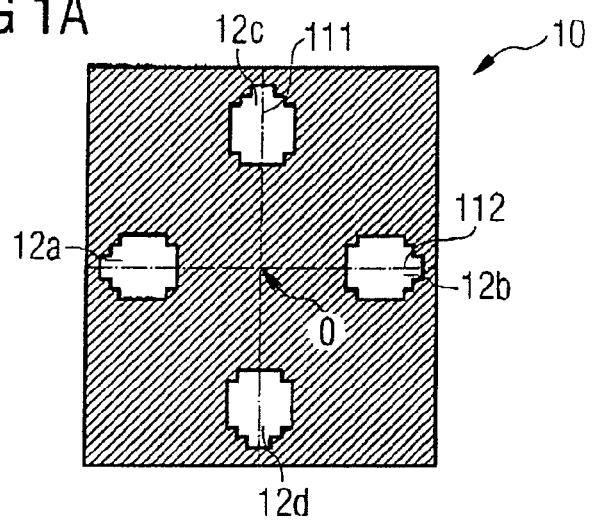
FIGS. 1A-C shows a comparison of illumination pupils according to the prior art (FIG. 1A) with those according to exemplary embodiments of the present invention (FIGS. 1B, 1C).
Figure 1B:
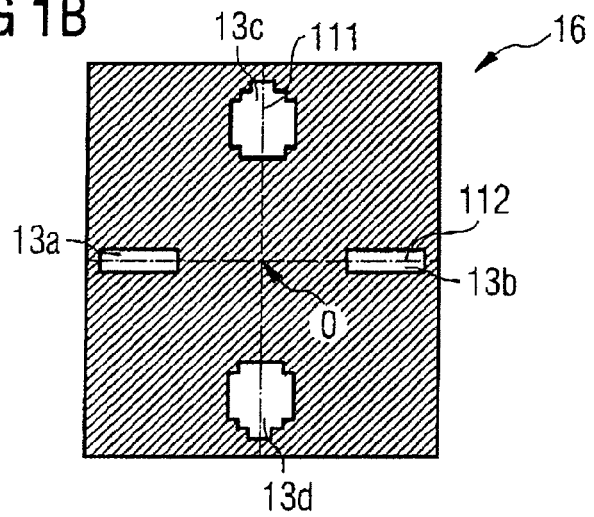
Figure 1C:
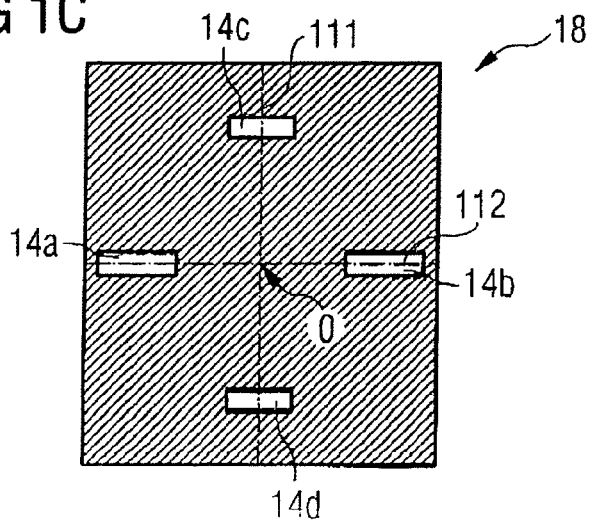

FIG. 1 shows a comparison of a pupil 10 for a quadrupole illumination from the prior art (FIG. 1A) with the illumination pupils (16, 18) of two examples according to the invention (FIGS. 1B, 1C). A conventional illumination pupil 10 has four bright zones 12a-12d arranged symmetrically with regard to a rotation through 90 degrees. They are arranged in each case at the same distance from a zero point position O on axes 111, 112 that are perpendicular to one another and cross at the zero point position.

A first example of a pupil 16 according to the invention in FIG. 1B has two rectangularly formed bright zones 13a, 13b on one of the axes 112, the longitudinal axis of the bright zones in each case matching the pupil axis 112. By contrast, the two further bright zones 13c and 13d on the axis 111, as also in the example with respect to the prior art, are formed essentially isotropically, i.e., having no appreciable longitudinal axis and differing in particular from the rectangular bright zones 13a and 13b. The arrangement is therefore asymmetrical.

A second example, in which all four bright zones 14a-14d are formed as elongate rectangles in the pupil plane 18, is shown in FIG. 1c. All four bright zones each have a longitudinal axis which in all cases extends in the direction of the pupil axis 112. Therefore, this arrangement is also asymmetrical. In other words, the arrangements in FIGS. 1B and 2C do not have full biaxial symmetry in the sense that the bright zones lying along pupil axis 112 are arranged differently with respect to the pupil axis 112 than the bright zones lying along axis 111 are arranged with respect to axis 111 (the longitudinal axis of bright zones 14a,b are parallel to the axis on which they lie (112), whereas the longitudinal axis of bright zones 14c,d are perpendicular to the axis on which they lie (111)).

In principle, however, the invention also encompasses the case of a symmetrical pupil, namely precisely when, proceeding from FIG. 1c, the longitudinal axes of the bright zones 14c, 14d are formed perpendicular to the axis 112, i.e., parallel to the axis 111. As will be shown with reference to FIG. 4, these two bright zones 14c, d contribute minimally to the imaging with regard to that part of the hybrid mask that is formed using alternating phase shift mask technology, so that from this aspect their orientation is of secondary importance.

Preferably, the midpoints of the four bright zones are at the same distance from the optical axis.

Figure 2:
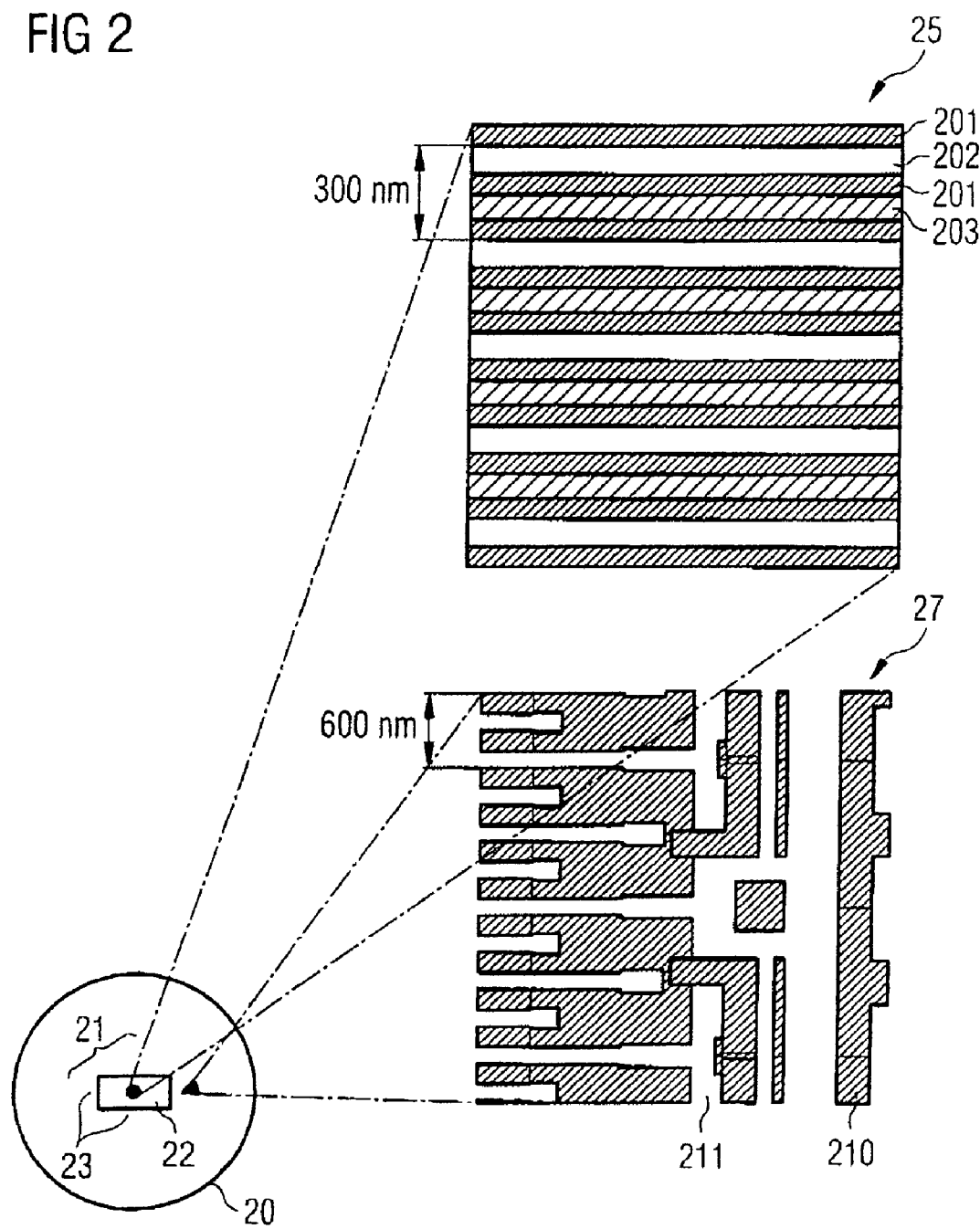
FIG. 2 shows an illustration of first and second regions of a hybrid mask.

FIG. 2 illustrates a hybrid mask 20 according to the invention, which is intended to be used together with the illuminator diaphragms shown in FIGS. 1B and 1C for an exposure. As can be seen in schematic illustration at the bottom on the left in FIG. 2, the mask 20 comprises a pattern 21 having two regions 22, 23. The first region 22 represents a cell array of a memory component, in which a line-space grating 25 represents the active zones to be formed. The second region 23 represents the periphery of the cell array, in which are typically formed connection contacts and transistors for driving and evaluating the information stored in the array of trench capacitors. A detail from the MUX space 27 is illustrated in enlarged fashion in the center of FIG. 2.

The line-space grating 25 in the first region 22 is formed using the technology of alternating phase shift masks. For this purpose, the lines 201 formed from chromium are surrounded by spaces 202, 203. The spaces 202 alternate with the spaces 203 in the grating sequence and differ in terms of their phase deviation. The spaces 202 have a phase deviation of 0 degrees, whereas the space 203 has a phase deviation of 180 degrees. The two space types are etched into the substrate with different depths using etching technology that is known to those skilled in the art and have the same transparency.

The grating 25 has a grating spacing of 300 nm, for example. The individual line is produced with a width of 70 nm and the space is produced with a width of 80 nm, for example.

The MUX space 27 is formed using the technology of conventional chromium masks. In this case, lines or webs 210 made of chromium are surrounded by spaces 211. The structures ending in fingerlike fashion which are typical of the MUX space likewise form a periodic grating. Consequently, the MUX space 27 is actually also appropriate for the alternating phase shift mask technology and thus for incorporation into the first region 22. As can be understood from FIG. 2, however, the transparent spaces 211 in the grating of the MUX space 27 are connected to one another and would therefore inevitably resulting in phase conflicts.

The MUX space 27 may also be formed from lines 210 having semitransparent absorber elements and a phase deviation of 180° surrounded by transparent spaces 211 having a phase deviation of 0°.

Figure 3:
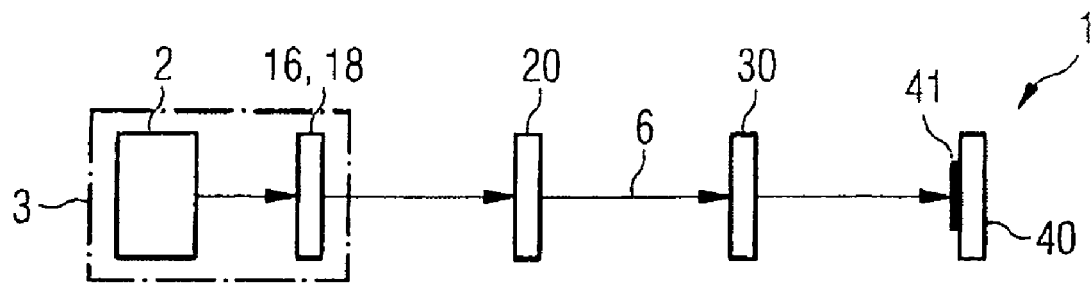
FIG. 3 shows an arrangement according to an exemplary embodiment of the invention.

FIG. 3 schematically illustrates an arrangement according to an exemplary embodiment of the invention. For convenience, the lens system is not shown therein. An exposure apparatus 1 has a radiation source 2 and an illumination pupil 16 or 18 according to the invention. The radiation source and the illumination pupil together form the effective source 3.

Figure 4:
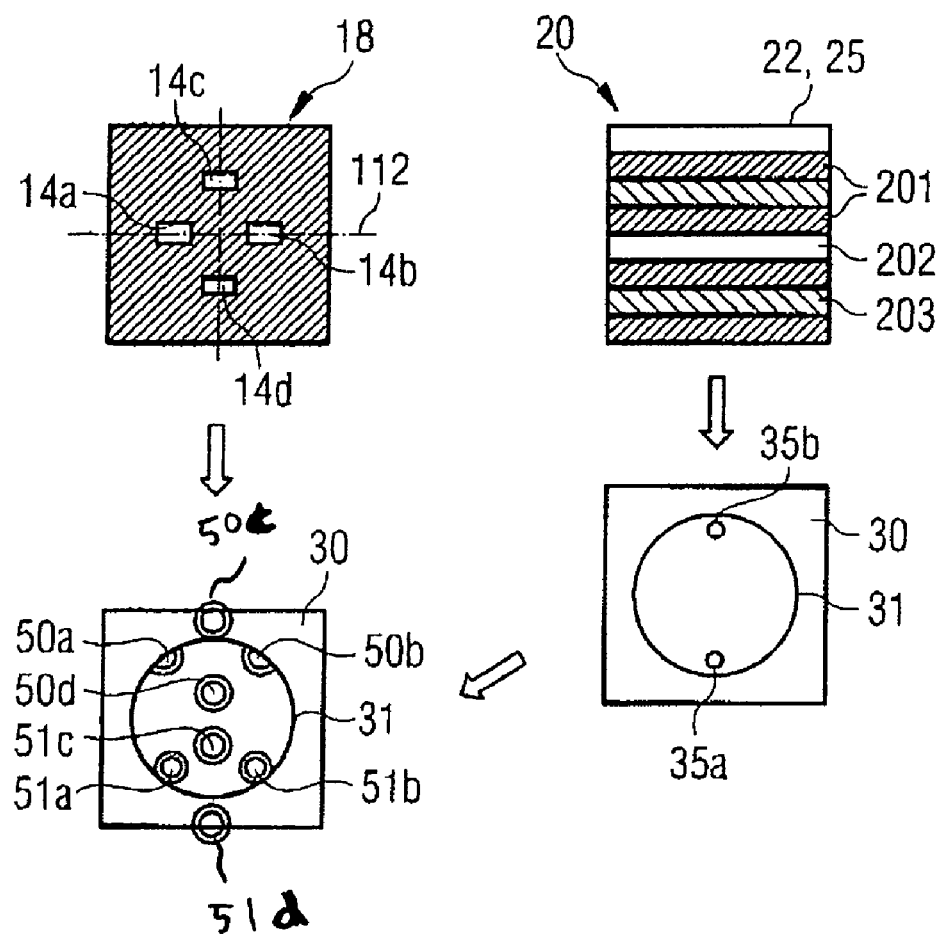
FIG. 4 shows a plan view of the first region which arises in the aperture plane.

The light distribution that results in the pupil plane is illustrated at the top on the left in FIG. 4. This corresponds to the arrangement of openings 13a-d or 14a-d convolved with the intensity distribution of the radiation source.

The hybrid mask 20 is introduced in the mask plane (FIG. 3), on which hybrid mask are formed the regions 22, 23 having lines and spaces using the technology of different types of masks. FIG. 4 partially shows, at the top on the right, the light distribution in the first region 22, which is of the alternating phase shift mask type and comprises critical structures, that is to say spaces having a width close to the resolution limit.

The light beam is guided along the optical axis 6 to the exit or aperture pupil 30 of the objective lens system. The aperture pupil may be characterized by a diaphragm having an opening. In a generalized manner, the opening is designated as a bright zone and this designates light-transmissive zones in the aperture plane.

In the aperture plane, the light distribution on account of the mask 20, taken by itself, represents the Fourier transform of the pattern 21 on the mask 20. It can be seen at the bottom on the right in FIG. 4. The pupil 30 has a circular bright zone 31. Light of higher orders of diffraction that occurs outside the bright zone 31 is masked out by the pupil 30. In this case, the orders of diffraction 35a, 35b of the region 22 from the pattern 21 still just lie in the bright zone 31 of the exit pupil 30.

In order, however, then to determine the distribution that actually arises in the Fourier plane of the pattern of the mask, the distribution in the pupil plane has to be convolved with that of the pattern 21 of the mask 20 in the aperture plane 30. The result can be seen at the bottom on the left in FIG. 4.

As is clearly discernible in FIG. 4, the elongate configuration of the bright zones and the asymmetrical arrangement make it possible for the orders of diffraction 50a, 51a originating from the bright zone 14a and the orders of diffraction 50b, 51b originating from the bright zone 14b to still just be kept in the bright zone 31 of the aperture or exit pupil 30 of the objective lens system. They can thus make a contribution to the image construction with regard to the region 22 in the image plane 40 that has been formed on the mask 20 using alternating phase shift mask technology (APSM technology for short). In this way, a high contrast with regard to the region 22 is achieved for the mask portion formed using APSM technology.

The two poles of the asymmetrical quadrupole illumination pupil which lie on the axis 112 contribute to enhancing the contrast of the APSM line-space grating and simultaneously enable a stabilization of those zones which form the end zones of the line-like structures of the MUX space, as is shown with reference to FIG. 5.

The bright zones, also called poles, 14a, 14b are arranged and shaped in elongate fashion such that two orders of diffraction of the line-space grating 25 which are capable of interference in each case contribute to each of the two poles. The position of the other two poles 14c and 14d in the illumination pupil, which only improve the imaging quality of the MUX space but do not contribute to the imaging of the APSM line-space grating, is chosen in such a way that only two diffraction maxima 50d, 51c that are not capable of interference with one another are situated within the bright zone 31 of the aperture, while the maxima 50c and 51d are positioned outside the bright zone 31.

Figure 5A:
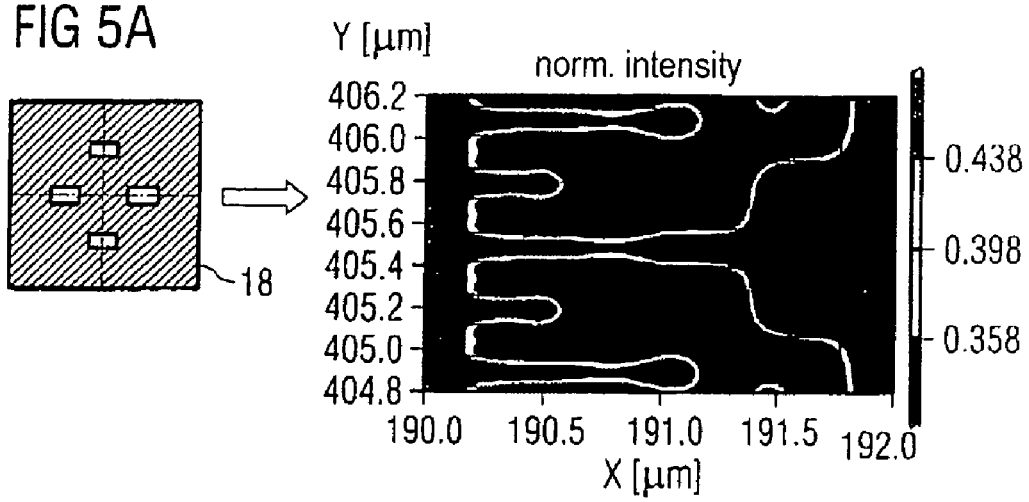
FIG. 5A-C shows a comparison of different illumination pupils and the resulting image of the second region.
Figure 5B:
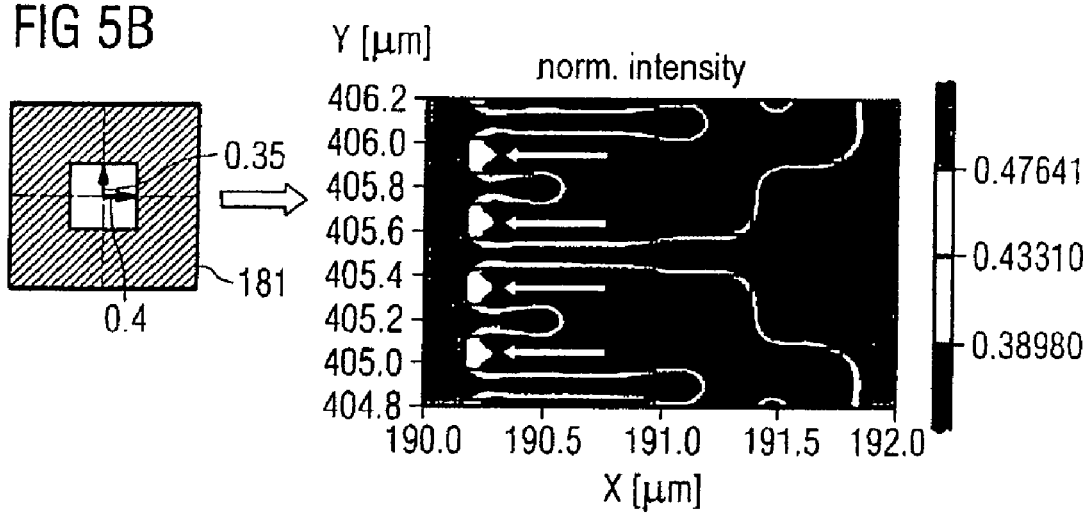
Figure 5C:
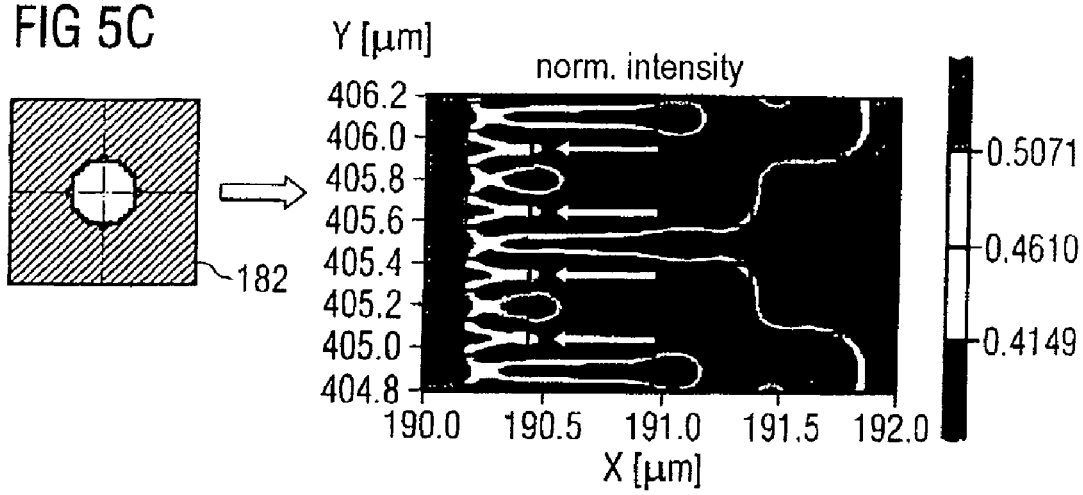

FIGS. 5A-5C show, with regard to the region 23 formed using conventional chromium or attenuated phase shift mask technology, in three different contour line diagrams, the comparison of an imaging by the illumination pupil according to the invention (FIG. 5A) with those of a rectangular and circular illumination pupil (FIGS. 5B and 5C). The illustration in each case shows the intensity distribution of the MUX space 27 in the image plane 40 in which, e.g., the resist-coated substrate 41 is introduced. The simulation represents a projection which was carried out at a defocus of 0.20 μm. This value represents a significant deviation from the best focus, but should still be encompassed by the permissible depth of field range in a typical projection.

For the circular 182 (FIG. 5C) illumination pupil centered on the zero point position O, it can clearly be discerned that the lines ending in fingerlike fashion split at their end and constrict the respectively intervening space. The splitting is indicated by arrows. This effect is undesirable, and the deviations are not acceptable from the standpoint either of the positional accuracy or of the line width.

In the case of the rectangular illumination pupil 181 (FIG. 5B), which is likewise centered, the degree of splitting is comparatively reduced relative thereto, but an acceptable imaging is not achieved here either.

It is only with the use of the illumination pupil 18 according to the invention (FIG. 5A) for quadrupole illumination that the layout of the MUX space 27 is imaged with high dimensional accuracy even at a defocus of 0.20 μm. The splitting of the line ends is evident only in incipient fashion.

As a result, it accordingly remains to be emphasized that the combination according to the invention of asymmetrical quadrupole illumination pupil 16, 18 and hybrid phase shift mask 20 yields satisfactory results both with regard to the contrast in the case of the imaging of the region 22 and with regard to the depth of field and line width stability in the case of the simultaneous imaging of the region 23. FIG. 6 shows a comparison of the contrast values for different values of the defocus during the imaging of the line-space grating 25 formed using APSM technology.

While even the circular illumination pupil 182 falls below the imaging-critical contrast threshold of 0.45 given defocusings of more than 0.2 μm, this limit is reached only at a defocus of more than 0.3 μm in the case of the asymmetrical quadrupole illumination pupil 16, 18. That is, the achievable depth of focus of the design according to the invention is greater by a factor 1.5. This results in better line width stability and a higher product yield in the semiconductor process.

At the same time, however, the imaging quality of the MUX space at the defocus (0.2 μm) is also better for the asymmetrical quadrupole illumination than for the other types of illumination (cf., FIG. 5).

According to the textbook Kwok-Kit Wong, A., "Resolution Enhancement Techniques in Optical Lithography", Tutorial Texts in Optical Engineering, Vol TT47, SPIE Press, 2001, page 120 et seq., the typical non-centered pupil geometries such as the annular diaphragm etc. do not contribute to improving the imaging of mask layouts using APSM technology alone. A corresponding improvement is achieved, by contrast, in the case of the simultaneous transfer of the MUX space in chromium-on-glass embodiments and of the line-space grating using APSM technology.

A method for setting the diaphragm according to the invention in the pupil plane provides for adapting the size of the four elongate illuminator openings in such a way as to achieve a best possible compromise for the simultaneous imaging of the line-space grating and the MUX space imaging with regard to MEEF, process window and also contrast.

In this case, reducing the size of the poles 13a, 13b or 14a, 14b arranged on the axis 112 results in an improvement of the imaging quality of the MUX space 27 at the expense of the contrast of the line-space grating 25. Conversely, the contrast of the line-space grating 27 can also be increased at the expense of the imaging quality of the MUX space 25 by reducing the size of the poles 13c, 13d or 14c, 14d on the axis 111.

A further aspect relates to the application of an OPC correction to the layout of the pattern before it is formed on the mask. This is because, under certain circumstances, using the illumination pupil according to the invention in an exposure of the hybrid mask, local thickenings and thinnings of narrow critical lines may occur at the edge region of the first region, in particular at the edge of a line-space grating in the transition region with respect to the second region. Since this effect is systematic, adaptations in the layout which compensate for such deviations from the predetermined desired mask values can be performed in the case of a rule-based or else a simulation-based OPC correction. In this case, it is possible to adapt the width both of chromium lines and phase-shifted spaces.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An apparatus for projecting a pattern into an image plane, comprising:
    a radiation source arranged along an optical axis and configured to project radiation toward the image plane;
    a mask arranged in a mask plane along the optical axis, wherein the pattern to be projected into the image plane is formed on the mask, and wherein the mask comprises a first region including an alternating phase shift mask and a second region including an attenuated phase shift mask or a chromium mask; and
    an illumination pupil configured to produce a quadrupole illumination for projection onto the mask, the illumination pupil including at least four bright zones spaced apart from the optical axis such that the second region is projected into the image plane with a selected depth of field range, wherein at least two of the bright zones are elongated such that the first region is projected into the image plane with a selected contrast.

2. The apparatus of claim 1, wherein the alternating phase shift mask is a line-space grating.

3. The apparatus of claim 2, wherein spaces of the line-space grating have the same transparency and have a phase difference of 180 degrees with respect to incident radiation from the radiation source.

4. The apparatus of claim 2, wherein lines and spaces of the line-space grating are oriented along an axis on the mask within the mask plane, and longitudinal axes of the bright zones that are elongated are arranged perpendicular to the axis of the lines and spaces of the line-space grating.

5. The apparatus of claim 4, wherein two of the bright zones that are elongated lie along a common longitudinal axis on opposing sides of the optical axis.

6. The apparatus of claim 5, wherein the common longitudinal axis intersects the optical axis.

7. The apparatus of claim 2, wherein the line-space grating of the first region corresponds to a pattern of active zones and isolation trenches in a memory cell array.

8. The apparatus of claim 2, wherein lines and spaces of the line-space grating, relative to the scale of the image plane, have a width of not more than 80 nanometers.

9. The apparatus of claim 1, wherein lines and spaces of a pattern in the second region have a width of more than 200 nanometers.

10. The apparatus of claim 1, wherein lines and spaces of a pattern in the second region have a width of not less than 300 nanometers.

11. The apparatus of claim 1, wherein the bright zones that are elongated are substantially rectangular.

12. The apparatus of claim 1, wherein midpoints of the four bright zones are at the same distance from the optical axis.

13. The apparatus of claim 1, wherein a pattern in the second region corresponds to a pattern of active zones and isolation trenches in a peripheral region of a memory cell array that comprises an MUX space.

14. The apparatus of claim 1, wherein the quadrupole illumination is asymmetrical.

15. The apparatus of claim 1, wherein the at least four bright zones are elongated along longitudinal axes lying parallel to one another.

16. A method for projecting a pattern into an image plane, comprising:
    providing a radiation source arranged along an optical axis and configured to project radiation toward the image plane;
    arranging in a mask plane along the optical axis a mask on which is formed the pattern to be projected into the image plane, the mask including a first region with an alternating phase shift mask and a second region with an attenuated phase shift mask or a chromium mask; and
    positioning an illumination pupil to produce a quadrupole illumination for projection onto the mask, the illumination pupil including at least four bright zones spaced apart from the optical axis such that the second region is projected into the image plane with a selected depth of field range, wherein at least two of the bright zones are elongated such that the first region is projected into the image plane with a selected contrast.

17. The method of claim 16, further comprising:
    forming the pattern on the mask based on a predetermined layout; and
    locally performing adaptations to at least one of a width of chromium lines, spaces, and a width of spaces that are mutually phase-shifted 180 degrees during projection from the mask onto a semiconductor substrate in the image plane to reduce a deviation of a line width that is imaged during projection of the pattern from the mask in the image plane from a desired value in the layout.

18. The method of claim 17, wherein the adaptations are applied selectively based on establishing a rule in the context of a rule-based Optical Proximity Correction (OPC) method or selectively based on a simulation-based OPC method.

19. The method of claim 17, wherein the adaptations are performed in a manner dependent on a horizontal or vertical structure orientation of lines in the first or second region.

20. The method of claim 17, wherein the adaptations in the layout are performed in an edge region of the first region.

21. The method of claim 16, further comprising:
    determining a contrast from an image of the first region generated in the image plane;
    determining a line width from an image of the second region generated in the image plane;
    comparing the contrast and the line width with tolerance values; and
    adapting at least one of a size, length, and width of the bright zones that are elongated in response to results of the comparison in order to increase the contrast.

22. The method of claim 16, further comprising:
determining a contrast from an image of the first region generated in the image plane;
determining a line width from an image of the second region generated in the image plane;
comparing the contrast and the line width with tolerance values; and
adapting a size of bright zones that are not elongated in response to the results of the comparison in order to increase the depth of field range.

\* \* \* \* \*